United States Patent  
Nomura et al.

(10) Patent No.: US 8,299,671 B2
(45) Date of Patent: Oct. 30, 2012

(54) PROCESSING APPARATUS

(75) Inventors: Masamichi Nomura, Nirasaki (JP);
Kenjiro Koizumi, Nirasaki (JP);
Shigeru Kasai, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 367 days.

(21) Appl. No.: 12/663,134

(22) PCT Filed: May 29, 2008

(86) PCT No.: PCT/JP2008/059892
§ 371 (c)(1),
(2), (4) Date: Dec. 4, 2009

(87) PCT Pub. No.: WO2008/149769
PCT Pub. Date: Dec. 11, 2008

(65) Prior Publication Data
US 2010/0164315 A1 Jul. 1, 2010

(30) Foreign Application Priority Data
Jun. 5, 2007 (JP) ................................. 2007-149631

(51) Int. Cl.
*H02K 7/09* (2006.01)
*H01L 21/00* (2006.01)
(52) U.S. Cl. ....................................... 310/90.5; 219/385
(58) Field of Classification Search ................. 310/90.5; 219/385
See application file for complete search history.

(56) References Cited

U.S. PATENT DOCUMENTS

| 5,332,442 | A | * | 7/1994 | Kubodera et al. | 118/725 |
| 5,818,137 | A | | 10/1998 | Nichols et al. | |
| 6,157,106 | A | | 12/2000 | Tietz et al. | |
| 6,437,290 | B1 | * | 8/2002 | Shao et al. | 219/390 |
| 6,479,801 | B1 | * | 11/2002 | Shigeoka et al. | 219/502 |
| 6,891,131 | B2 | * | 5/2005 | Sakuma et al. | 219/390 |
| 2004/0004989 | A1 | * | 1/2004 | Shigeoka | 374/121 |
| 2004/0013419 | A1 | * | 1/2004 | Sakuma et al. | 392/411 |

FOREIGN PATENT DOCUMENTS

| JP | 09205132 A * | 8/1997 |
| JP | 11 513880 | 11/1999 |
| JP | 2000 515331 | 11/2000 |
| JP | 2002 16125 | 1/2002 |
| JP | 2002 93724 | 3/2002 |
| WO | WO 0223596 A1 * | 3/2002 |

OTHER PUBLICATIONS

Japanese Office Action issued Sep. 13, 2011, in Patent Application No. 2007-149631 (with English-language translation).

(Continued)

*Primary Examiner* — Quyen Leung
*Assistant Examiner* — Alex W Mok
(74) *Attorney, Agent, or Firm* — Oblon, Spivak, McClelland, Maier & Neustadt, L.L.P.

(57) ABSTRACT

A rotary floater (30) for supporting an object to be processed (W) is floated by the magnetic attraction of a floating electromagnet assembly (F), and the rotary floater (30) is rotated by the magnetic attraction of a rotary electromagnet assembly (R) while its horizontal position being controlled by the magnetic attraction of a positioning electromagnet assembly (H). The floating electromagnet assembly (F) causes the magnetic attraction to act vertically upwardly, so that the rotary floater (30) is floated and suspended without contact with the inner wall of a processing container (2).

26 Claims, 9 Drawing Sheets

OTHER PUBLICATIONS

Chinese Office Action issued Mar. 9, 2011, in Patent Application No. 200880018879.5 (with English-language translation, please note that the reference JP 2002-061625A in the original Chinese Office Action contains a typographical error, and should read JP 2002-016125A, as is correctly shown in the English-language translation.).

* cited by examiner

PROCESSING APPARATUS

FIELD OF THE INVENTION

The present invention relates to a processing apparatus for processing an object to be processed, e.g., a semiconductor wafer or the like.

BACKGROUND OF THE INVENTION

Generally, in order to manufacture a semiconductor integrated circuit, various thermal processes such as a film forming process, an annealing process, an oxidation and diffusion process, a sputtering process, an etching process and the like are repeatedly performed several times repeatedly on a semiconductor wafer.

The factors for improving uniformity of a film quality, a film thickness and the like on the semiconductor wafer include uniformity of distribution or flow of a reactant gas, uniformity of a wafer temperature, uniformity of a plasma and the like.

In order to obtain such uniformity in the circumferential direction of the wafer, it is required to rotate the wafer. A conventional wafer rotating mechanism includes a disc-shaped member for supporting a wafer; and a driving mechanism for rotating the disc-shaped member by frictional force generated by contact between the driving mechanism and the disc-shaped member.

Since, however, friction between objects generates particles, it is inevitable that particles are generated from contact/friction portions in the conventional wafer rotating mechanism. Further, misalignment due to sliding occurs between the disc-shaped member for supporting the wafer and a rotation unit of the driving mechanism for the disc-shaped member, so that a returning operation to a reference position is required each time. This causes deterioration of a throughput.

In view of the above, U.S. Pat. No. 6,157,106 (hereinafter, referred to as "Patent Document 1") discloses a configuration in which a rotor for supporting a wafer is rotated while being magnetically floated so that particles are not generated in a processing chamber. In the technique disclosed in Patent Document 1, the rotor is a constituent element for floating a rotor system by magnetic force. Moreover, a magnetic field is generated by a stator assembly including a permanent magnet for floating and an electromagnet for control.

In the technique described in Patent Document 1, although the rotor is floated by magnetic force applied thereto in a horizontal direction, the direction of the magnetic force does not coincide with the vertical direction of gravity applied to the rotor, so that vector directions of acting force are dispersed. As a result, it is complicated and difficult to control the magnetic floating.

SUMMARY OF THE INVENTION

The present invention provides a processing apparatus capable of preventing generation of particles and obtaining desired in-plane uniformity due to floating rotation by its simple structure and simple control operation.

In accordance with an embodiment of the invention, there is provided a processing apparatus including: a processing container made of a non-ferromagnetic material, for accommodating an object to be processed; a rotary floater disposed in the processing container, for supporting the object to be processed; at least one floating electromagnet assembly provided outside the processing container, for floating the rotary floater without contact with an inner wall of the processing container by causing magnetic attraction to the rotary floater vertically upwardly; at least one positioning electromagnet assembly provided outside the processing container, for controlling a horizontal direction position of the floated rotary floater by applying magnetic attraction thereto; at least one rotary electromagnet assembly disposed outside the processing container for rotating the floated rotary floater by applying magnetic attraction thereto; and a processing mechanism for performing a predetermined processing on the object to be processed supported by the rotary floater.

In the processing apparatus, the rotary floater may have a floater side floating ferromagnetic member having a predetermined width extending in a diametrical direction. The floater side floating ferromagnetic member may be formed in a flat ring shape.

In the processing apparatus, the floating electromagnet assembly may include: a pair of electromagnets provided outside the processing container and connected at rear portions thereof by a yoke; and a pair of electromagnet side floating ferromagnetic members disposed below front sides of the pair of electromagnets in the processing container so as to face a floater side floating ferromagnetic member via a predetermined gap therebetween, for applying magnetic attraction to the floater side floating ferromagnetic member, wherein the pair of electromagnets, the yoke, the pair of electromagnet side floating ferromagnetic members and the floater side floating ferromagnetic members form a closed magnetic circuit. The floater side floating ferromagnetic member may be formed in a flat ring shape, and wherein the electromagnet side floating ferromagnetic members may extend in a circumferential direction along the floater side floating ferromagnetic member.

In the processing apparatus, the processing container may have grooves which open upward in an outer wall thereof, the electromagnets being fitted in the grooves from an outer upper side of the processing container, and wherein the electromagnet side floating ferromagnetic members may face the electromagnets disposed outside the processing container via thin bottom walls of the grooves. The processing container may have openings penetrating an outer wall thereof vertically, and the electromagnets may be fitted thereinto from an outer upper side of the processing container; sealing members are provided between the holes and the electromagnets; and the electromagnet side floating ferromagnetic members are installed at the electromagnets provided outside the processing container.

In the processing apparatus, at least three floating electromagnet assemblies may be disposed along an outer circumference of the rotary floater.

The processing apparatus may further include vertical position sensors for detecting position information of the rotary floater in a vertical direction.

The processing apparatus may further include a control unit for supplying control current to the electromagnets of the floating electromagnet assembly by calculating a vertical position, an inclination, a displacement velocity and an acceleration at that moment, based on the vertical position information of the rotary floater which is detected by the vertical position sensors, and calculating optimal values thereof.

In the processing apparatus, the rotary floater may have a floater side controlling ferromagnetic member having a predetermined width extending in a vertical direction. The floater side controlling ferromagnetic member may be formed in a cylindrical shape.

In the processing apparatus, the positioning electromagnet assembly may include: a pair of electromagnets provided outside the processing container and connected at rear portions thereof by a yoke; and a pair of electromagnet side positioning ferromagnetic members disposed at lateral portions of front sides of the pair of electromagnets in the processing container to face the floater side controlling ferromagnetic member via a predetermined gap therebetween, for applying magnetic attraction to the floater side controlling ferromagnetic member, wherein the pair of electromagnets, the yoke, the pair of electromagnet side positioning ferromagnetic members and the floater side controlling ferromagnetic member form a closed magnetic circuit. The floater side controlling ferromagnetic member may be formed in a cylindrical shape, and wherein the electromagnet side positioning ferromagnetic members may extend in a circumferential direction along the floater side controlling ferromagnetic member.

In the processing apparatus, the processing container may have grooves which open in an outer wall thereof horizontally, the electromagnets being fitted in the grooves from an outer lateral side of the processing container, and wherein the electromagnet side positioning ferromagnetic members may be provided to face the electromagnets disposed outside the processing container via thin bottom walls of the grooves. The processing container may have opening penetrating on outer wall thereof horizontally, and the electromagnets are fitted thereinto from an outer lateral side of the processing container; sealing members are provided between the holes and the electromagnets; and the electromagnet side positioning ferromagnetic members are installed at the electromagnets provided outside the processing container.

In the processing apparatus, at least three positioning electromagnet assemblies may be disposed along the outer circumference of the rotary floater.

The processing apparatus may further include horizontal position sensors for detecting position information of the rotary floater in the horizontal direction.

The processing apparatus may further include a control unit for supplying control current to the electromagnets of the positioning electromagnet assembly by calculating a horizontal position, a velocity and an acceleration at that moment, based on horizontal position information of the rotary floater which is detected by the horizontal position sensors, and calculating optimal values thereof. The processing apparatus may further include a control unit for supplying control current to the electromagnets of the rotary electromagnet assembly by calculating a rotation speed and an acceleration at that moment, based on horizontal position information of the rotary floater which is detected by the horizontal position sensors, and calculating optimal values thereof.

In the processing apparatus, the positioning electromagnet assembly and the rotary electromagnet assembly may be positioned in substantially the same horizontal locations.

In the processing apparatus, the rotary electromagnet assembly may include: a pair of electromagnets provided outside the processing container and connected at rear portions thereof by a yoke; and a pair of electromagnet side rotary ferromagnetic members disposed at lateral portions of front sides of the pair of electromagnets in the processing container to face the floater side controlling ferromagnetic member via a predetermined gap therebetween, for applying magnetic attraction to the floater side controlling ferromagnetic member, wherein the pair of electromagnets, the yoke, the pair of electromagnet side rotary ferromagnetic members and the floater side controlling ferromagnetic member form a closed magnetic circuit. Uneven tooth profiles may be formed on surfaces of the floater side controlling ferromagnetic member and the electromagnet side rotary ferromagnetic members facing each other. In the processing apparatus the floater side controlling ferromagnetic member may be formed in a cylindrical shape, and wherein the electromagnet side rotary ferromagnetic members extend in a circumferential direction along the floater side controlling ferromagnetic member.

In the processing apparatus, the processing container may have grooves which open on in outer wall thereof horizontally, the electromagnets being fitted from an outer lateral side of the processing container, and wherein the electromagnet side rotary ferromagnetic members are provided to face the electromagnets disposed outside the processing container via thin bottom walls of the grooves. The processing container may have openings penetrating an outer wall thereof horizontally, and the electromagnets are fitted thereinto from an outer lateral side of the processing container; sealing members are provided between the holes and the electromagnets; and the electromagnet side rotary ferromagnetic members are installed at the electromagnets provided outside the processing container.

In the processing apparatus, two rotary electromagnet assemblies may form a pair, and the rotary electromagnet assemblies in each pair may be provided opposite to each other in a diametrical direction, and at least two pairs of rotary electromagnet assemblies may be arranged along an outer circumference of the rotary floater.

In the processing apparatus, the positioning electromagnet assembly and the rotary electromagnet assembly may be arranged alternately in a circumferential direction.

DETAILED DESCRIPTION OF THE EMBODIMENT

Hereinafter, embodiments of the present invention will be described in detail with reference to the accompanying drawings. Here, an annealing apparatus for annealing a wafer will be described as an example.

Figure 1:
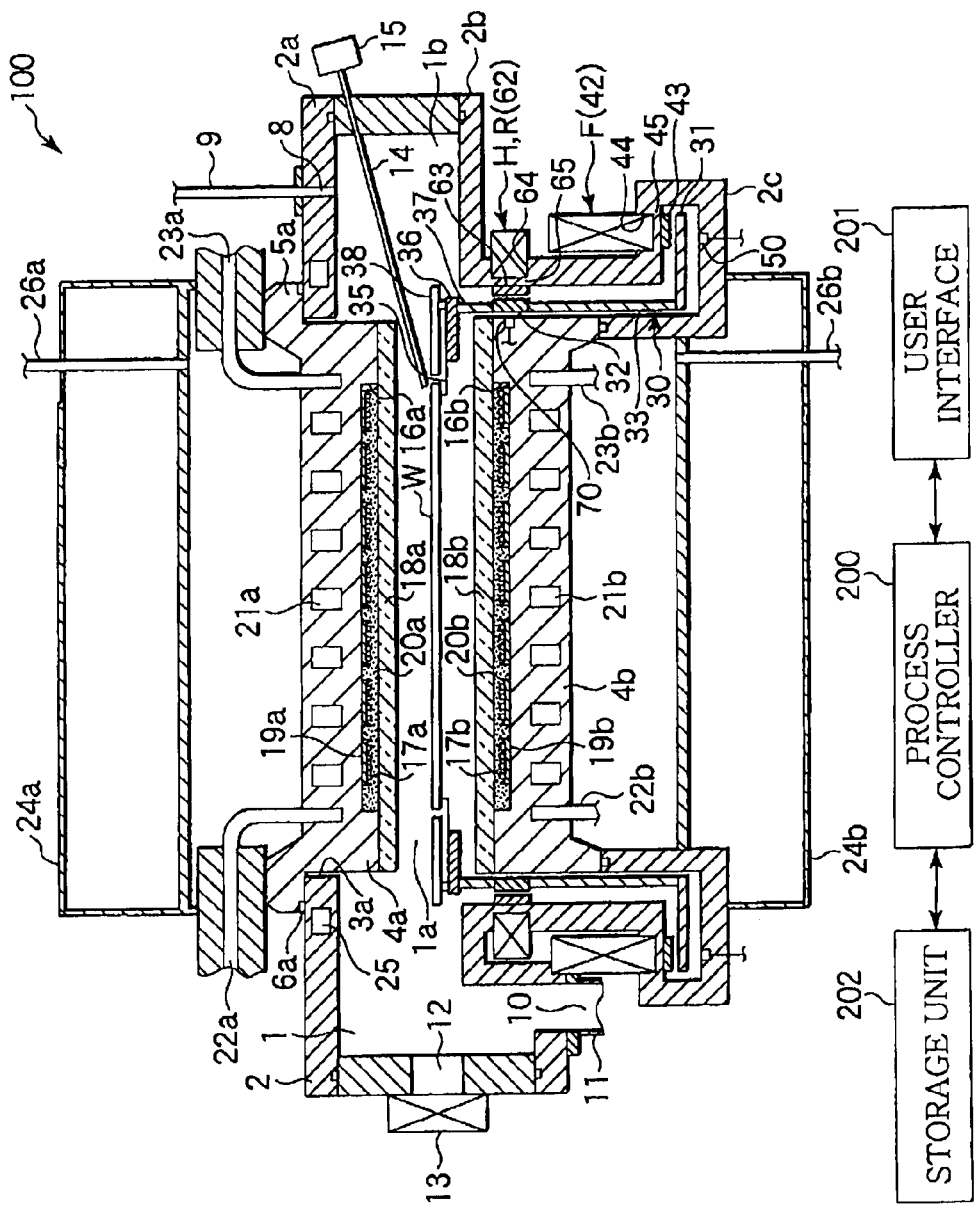
FIG. 1 is a cross sectional view showing a schematic configuration of an annealing apparatus in accordance with an embodiment of the present invention.

FIG. 1 is a cross sectional view showing a schematic configuration of an annealing apparatus in accordance with an embodiment of the present invention. An annealing apparatus 100 includes an airtight processing chamber 1 into which a wafer W is loaded.

The processing chamber 1 has a cylindrical annealing processing portion 1a where the wafer W is disposed; and a doughnut-shaped gas diffusion portion 1b arranged around the annealing processing portion 1a. The gas diffusion portion 1b has a height higher than that of the annealing processing portion 1a, and the processing chamber 1 has an H-shaped cross section.

The gas diffusion portion 1b of the processing chamber 1 is defined by the processing container 2. Circular openings 3a (only the upper side is shown) corresponding to the annealing processing portion 1a are formed on a top wall 2a and a bottom wall 2b of the processing container 2, and cooling members 4a and 4b made of a high thermal conductive material such as copper or the like are respectively inserted into these openings 3a.

The cooling members 4a and 4b have flange portions 5a (only the upper side is shown), and the flange portions 5a are closely adhered to the top wall 2a of the processing container 2 via sealing members 6a. Further, the annealing processing portion 1a is defined by the cooling members 4a and 4b.

A rotary floater 30 for horizontally supporting the wafer W in the annealing processing portion 1a is provided in the processing chamber 1. The rotary floater 30 is floated by a floating electromagnet assembly F and is rotated by a rotary electromagnet assembly R, as will be described later. Moreover, a processing gas inlet opening 8 for introducing a predetermined processing gas from a processing gas supply mechanism (not shown) is provided on the ceiling wall of the processing container 2, and a processing gas line 9 for supplying a processing gas is connected to the processing gas inlet opening 8. Further, a gas exhaust port 10 is provided on the bottom wall of the processing container 2, and is connected to a gas exhaust line 11 connected to a gas exhaust unit (not shown).

Furthermore, a loading/unloading port 12 for loading and unloading the wafer W into and from the processing container 2 is provided on a sidewall of the processing container 2, and can be open and closed by a gate valve 13. The processing chamber 1 has a temperature sensor 14 for measuring a temperature of the wafer W. Besides, the temperature sensor 14 is connected to a measurement unit 15 provided outside the processing container 2, and a temperature detection signal is outputted from the measurement unit 15 to a process controller 200 to be described later.

Circular recesses 16a and 16b are formed in the surfaces of the cooling members 4a and 4b so as to correspond to the wafer W. In the recesses 16a and 16b, there are provided heating sources having light emitting diodes (LEDs) 17a and 17b so as to be in contact with the cooling members 4a and 4b.

The heating sources are formed of LED arrays in which a plurality of LEDs 17a and 17b is mounted on supporting bodies 19a and 19b made of a high thermal conductive material having insulating properties, typically AlN ceramics.

Control boxes 24a and 24b for controlling power supply to the LEDs 17a and 17b are provided above the cooling member 4a and below the cooling member 4b, respectively, and are connected to wiring from a power supply (not shown) to control power supply to the LEDs 17a and 17b.

Light-transmitting members 18a and 18b for transmitting light from the LEDs 17a and 17b of the heating sources toward the wafer W are fixed by screws on the surfaces of the cooling members 4a and 4b which face the wafer W. The light-transmitting members 18a and 18b are made of a material, e.g., quartz, which effectively transmits light emitted from the LEDs.

Moreover, a space defined by the recess 16a and the light-transmitting member 18a and a space defined by the recess 16b and the light-transmitting member 18b are filled with transparent resins 20a and 20b. The applicable resins 20a and 20b include silicon resin, epoxy resin and the like.

The cooling members 4a and 4b are provided with coolant flow paths 21a and 21b for circulating therein a liquid coolant, e.g., fluorine-based inactive liquid (Fluorinert (trademark), Galden (trademark) or the like) capable of cooling the cooling members 4a and 4b to a temperature of 0° C. or less, e.g., about −50° C. The coolant flow paths 21a and 21b of the cooling members 4a and 4b are connected to coolant supply lines 22a and 22b and coolant discharge lines 23a and 23b. Therefore, the cooling members 4a and 4b can be cooled by circulating the coolant in the coolant flow paths 21a and 21b.

Further, a cooling water flow path 25 is provided at the processing container 2, and cooling water of a room temperature is made to circulate therein. Accordingly, it is possible to prevent an excessive increase of a temperature of the processing container 2. Moreover, a dry gas is introduced into spaces between the control boxes 24a and 24b and the cooling members 4a and 4b via gas lines 26a and 26b.

Furthermore, the components of the annealing apparatus 100 are connected to and controlled by a process controller 200 having a microprocessor (computer). For example, the process controller 200 performs power supply control of the control boxes 24a and 24b, control of a driving system, control of a gas supply operation and the like. The process controller 200 is connected to a user interface 201 having a keyboard with which a process operator inputs commands to operate the annealing apparatus 100, a display for visually displaying the operation status of the annealing apparatus 100 and the like. Further, the process controller 200 is connected to a storage unit 202 storing control programs for implementing various processes executed by the annealing apparatus 100 under control of the process controller 200 and programs, i.e., recipes, for operating each component of the annealing apparatus 100 based on the processing conditions. The recipes may be stored in a hard disk or a semiconductor memory, or may be set in a predetermined position of the storage unit 202 while being stored in a portable storage medium such as a CDROM, a DVD or the like. In addition, the recipes may be transmitted properly from another device via, e.g., a dedicated line. Further, if necessary, a required recipe is retrieved from the storage unit 202 and executed by the process controller 200 by instructions from the user interface 201, thereby performing a desired processing in the annealing apparatus 100 under the control of the process controller 200.

Hereinafter, an operation of the rotary floater 30 will be explained.

In this embodiment, the rotary floater 30 supporting an object to be processed W is floated by magnetic attraction of the floating electromagnet assembly F without contact with the processing container 2, and the rotary floater 30 is rotated by magnetic attraction of the rotary electromagnet assembly R while its horizontal position being controlled by magnetic attraction of a positioning electromagnet assembly H.

Figure 2:
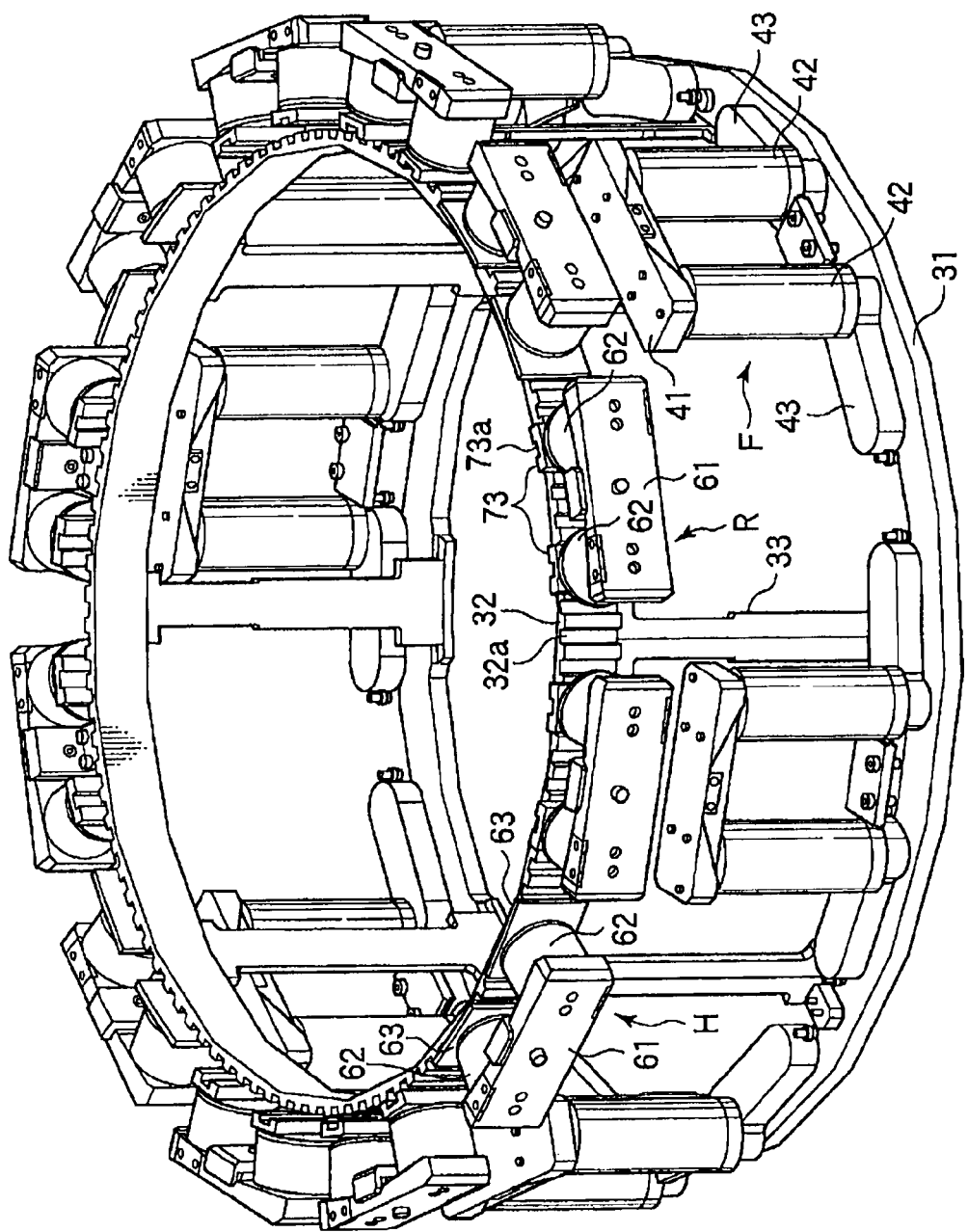
FIG. 2 describes a perspective view of a rotary floater and electromagnet assemblies shown in FIG. 1.
Figure 3:
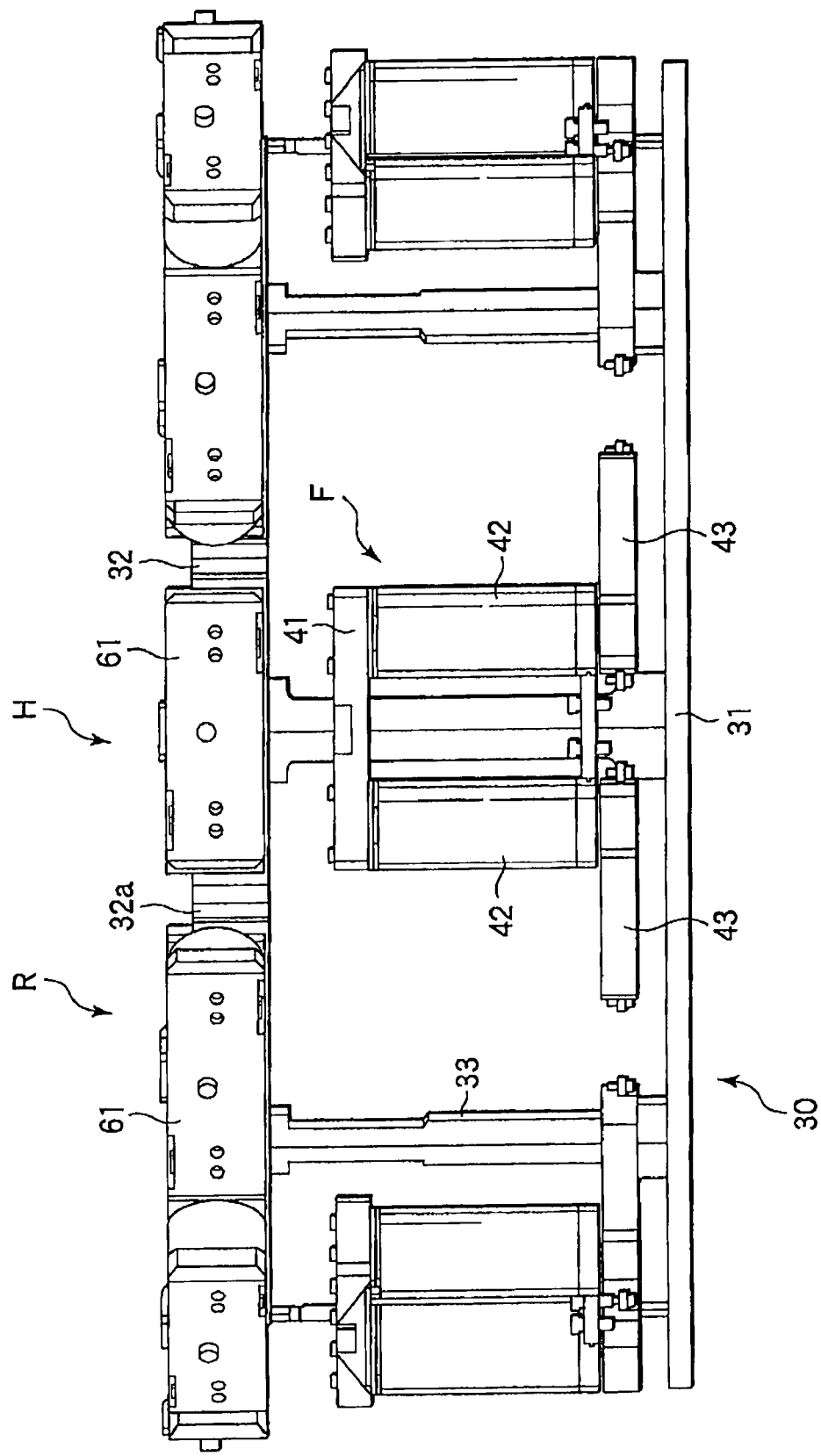
FIG. 3 provides a side view of the rotary floater and the electromagnet assemblies illustrated in FIG. 1.
Figure 4:
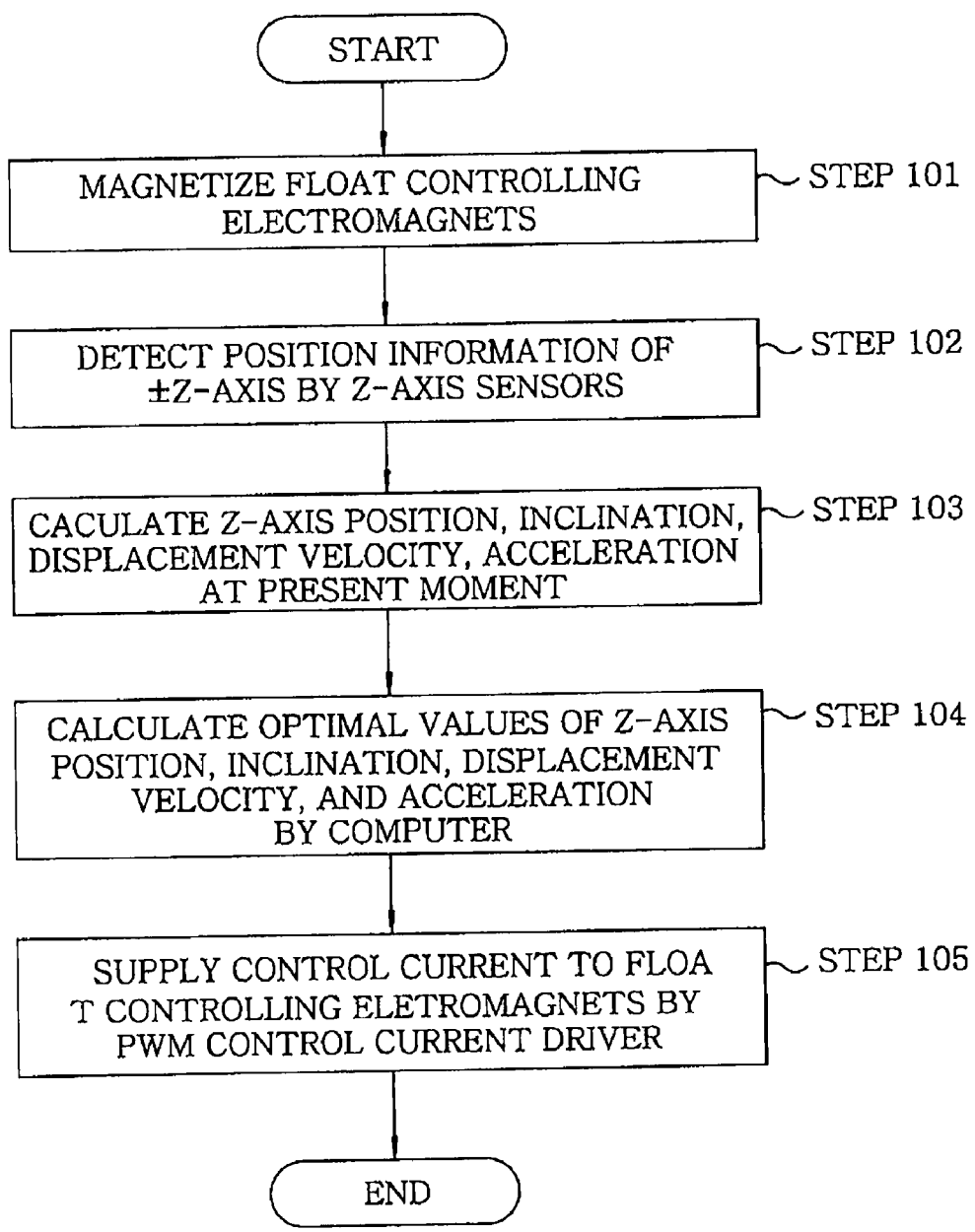
FIG. 4 presents a flowchart illustrating a control flow of a floating electromagnet assembly.

FIG. 2 describes a perspective view of the rotary floater and the electromagnet assemblies shown in FIG. 1, FIG. 3 provides a side view of the rotary floater and the electromagnet assemblies illustrated in FIG. 1, and FIG. 4 presents a flowchart illustrating a control flow of the floating electromagnet assembly.

As illustrated in FIG. 1, a hollow floating wall portion 2c is formed below the bottom wall 2b of the processing container 2 made of a non-magnetic material such as aluminum or the like so that the rotary floater 30 can be floated and moved vertically without contact therewith.

As shown in FIGS. 1 and 2, the rotary floater 30 has a floater side floating ferromagnetic member 31 having a predetermined width extending from its lower lateral portion in a diametrical direction, and the floater side floating ferromagnetic member 31 is formed in flat ring shape and is made of a ferromagnetic material such as Fe or the like which is coated with Ni.

The rotary floater 30 also has at its upper side portion a floater side controlling ferromagnetic member 32 having a predetermined width extending in a vertical direction, and the floater side controlling ferromagnetic member 32 is formed in a cylindrical shape and is made of a ferromagnetic member such as Fe or the like which is coated with Ni.

The floater side floating ferromagnetic member 31 and the floater side controlling ferromagnetic member 32 are connected to each other by a plurality of supporting members 33 made of a non-magnetic member such as aluminum or the like.

The wafer W is supported by a thin ring member 35, and the thin ring member 35 is supported by a flat ring-shaped supporting member 36. The supporting member 36 is supported by a cylindrical member 37, and is disposed at an upper portion of the rotary floater 30. Further, a soaking ring 38 is provided above the supporting member 36.

As can be seen from FIG. 3, the floating electromagnet assembly F includes a pair of electromagnets 42 which is provided outside the processing container 2 and connected to each other at rear portions thereof by a yoke 41; and a pair of electromagnet side floating ferromagnetic members 43 which is disposed below the front sides of the electromagnets 42 in the processing container 2 so as to face the floating side floating ferromagnetic member 31 via a predetermined gap therebetween and applies magnetic attraction to the floater side floating ferromagnetic member 31. Accordingly, a closed magnetic circuit is formed by the pair of electromagnets 42, the yoke 41, the pair of electromagnet side floating ferromagnetic members 43 and the floater side floating ferromagnetic member 31.

As depicted in FIGS. 2 and 3, the electromagnet side floating ferromagnetic members 43 extend along the circumferential direction of the floater side floating ferromagnetic member 31 formed in a flat ring shape. Accordingly, an active magnetic area of the magnetic circuit increases and a magnetic resistance decreases, so that the effective floating can be achieved.

As described in FIG. 1, the floating wall portion 2c of the processing container 2 has grooves 44 which open upward in its outer wall, the electromagnets 42 being fitted in the grooves 44 from an outer upper side of the processing container 2. The electromagnet side floating ferromagnetic members 43 face the electromagnets 42 provided outside the floating wall portion 2c via thin bottom walls 45 of the grooves. Accordingly, there arises no need to provide a through hole or the like at the processing container 2, and vacuum sealing of the electromagnets 42 becomes unnecessary, thereby increasing reliability against vacuum leakage of the processing container 2. Further, a thickness of the thin walls 45 is, e.g., about 2 mm.

As illustrated in FIG. 2, two floating electromagnet assemblies F form a pair, and the floating electromagnet assemblies F in each pair are disposed opposite to each other in a diametrical direction. For example, three pairs of floating electromagnet assemblies F spaced apart from each other at, e.g., about 120 degrees, are arranged along the outer circumference of the rotary floater 30. The floating electromagnet assemblies F are required to independently control an inclination of the rotary floater 30, as will be described later, and it is preferable to provide at least three pairs of floating electromagnet assemblies F. Besides, the floating electromagnet assembly F may have a single electromagnet and at least three floating electromagnet assemblies may be disposed along the outer circumference of the rotary floater 30.

As shown in FIG. 1, a position in which the rotary floater 30 is floated by, e.g., about 2 mm, from the bottom surface of the processing container 2 is a normal position. In the normal position, horizontal position control and rotation control which will be described later are carried out. Moreover, a position raised from the normal position by, e.g., about 10 mm, is a position for replacing an object to be processed. In that position, the object to be processed W is loaded and unloaded. Besides, the rotary floater 30 is configured to be able to be raised further by, e.g., about 2 mm, from the position for replacing the object to be processed as a preliminary position.

As such, if a floating stroke required for vertical movement of the object to be processed W is set, the elevation mechanism of the object to be processed W can be realized by magnetic floating. Accordingly, the structure can be simplified without requiring a conventional elevation mechanism motor, air cylinder or the like.

As shown in FIG. 1, vertical position sensors 50 (Z-axis sensor) for detecting position information of the rotary floater 30 in a vertical direction are provided to face the floater side floating ferromagnetic member 31. Three vertical position sensors 50 (Z-axis sensors) are provided while being spaced apart from each other at, e.g., about 120 degrees.

The floating electromagnetic assemblies F are feedback-controlled in the following sequence based on the detection data of the Z-axis sensors 50, as illustrated in FIG. 4.

First, the electromagnets 42 of the floating electromagnet assemblies F are magnetized (step 101). Then, position information of the rotary floater 30 in the vertical direction (Z-axis) is detected by the Z-axis sensors 50 (step 102). Next, a vertical direction (Z-axis) position, an inclination, a displacement velocity, an acceleration at that moment are calculated based on the position information of the rotary floater 30 in the vertical direction (step 103). Thereafter, optimal values of the vertical direction (X-axis) position, the inclination, the displacement velocity, and the acceleration are calculated by the computer (step 104).

The magnetization of the electromagnets 42 is controlled by supplying control current to the electromagnets 42 of the floating electromagnet assemblies F by a PWM (Pulse Width Modulation) control current driver based on the calculation result (step 105). Moreover, the PWM control current driver magnetizes the electromagnets 42 at regular pulse intervals, and controls the magnetization of the electromagnets 42 while varying a duty ratio (ratio of ON time) of a pulse.

As described above, in this embodiment, the rotary floater 30 is floated and supported without contact with the inner wall of the processing container 2 by the floating electromagnet assemblies F which causes magnetic attraction to the rotary floater 30 vertically upwardly. Therefore, the direction of the magnetic attraction coincides with the direction of the gravity applied to the rotary floater 30. For that reason, horizontal misalignment does not occur, and the control can be stably carried out.

Figure 5:
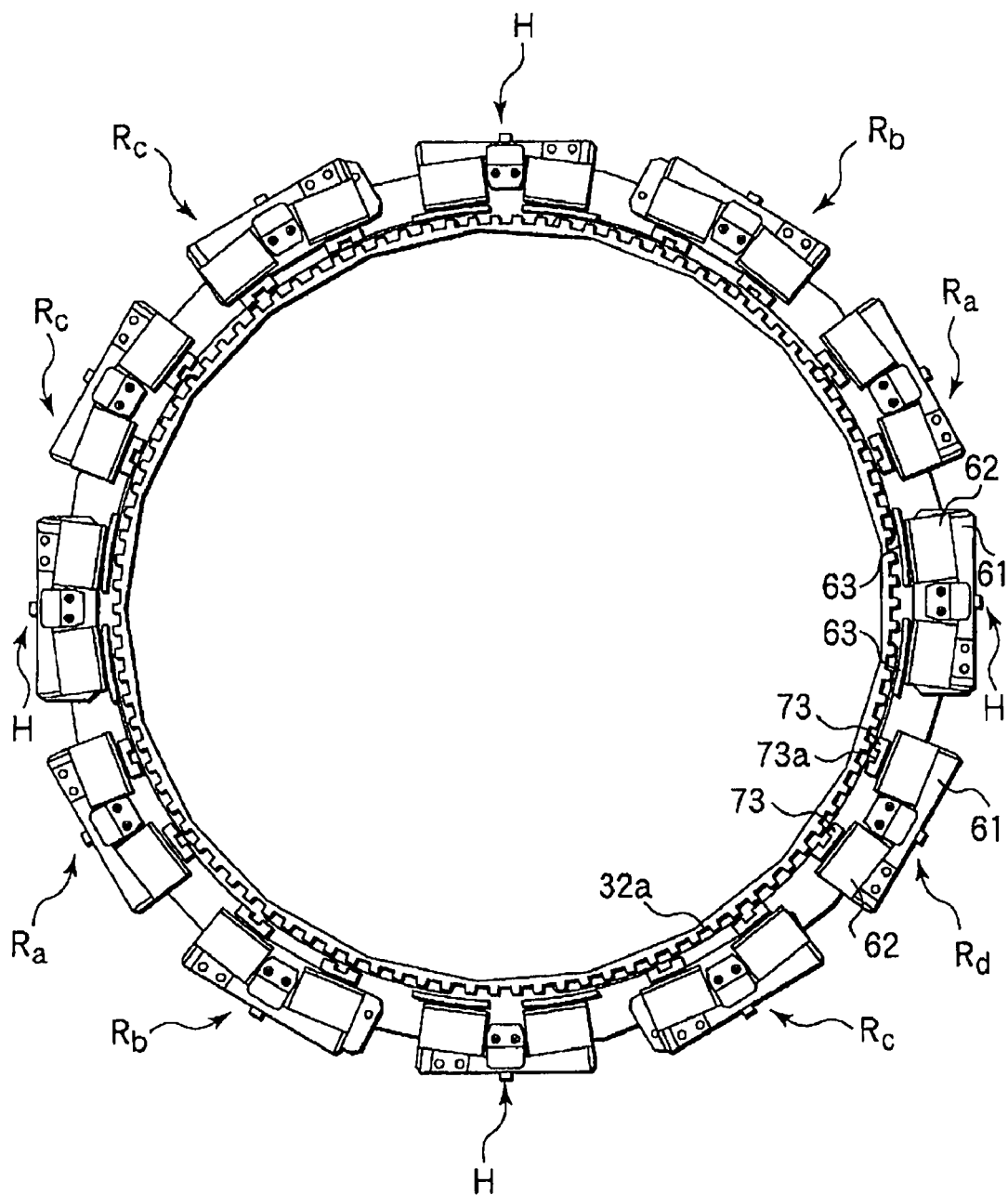
FIG. 5 represents a top view of the rotary floater and the electromagnet assemblies depicted in FIG. 1.
Figure 6:
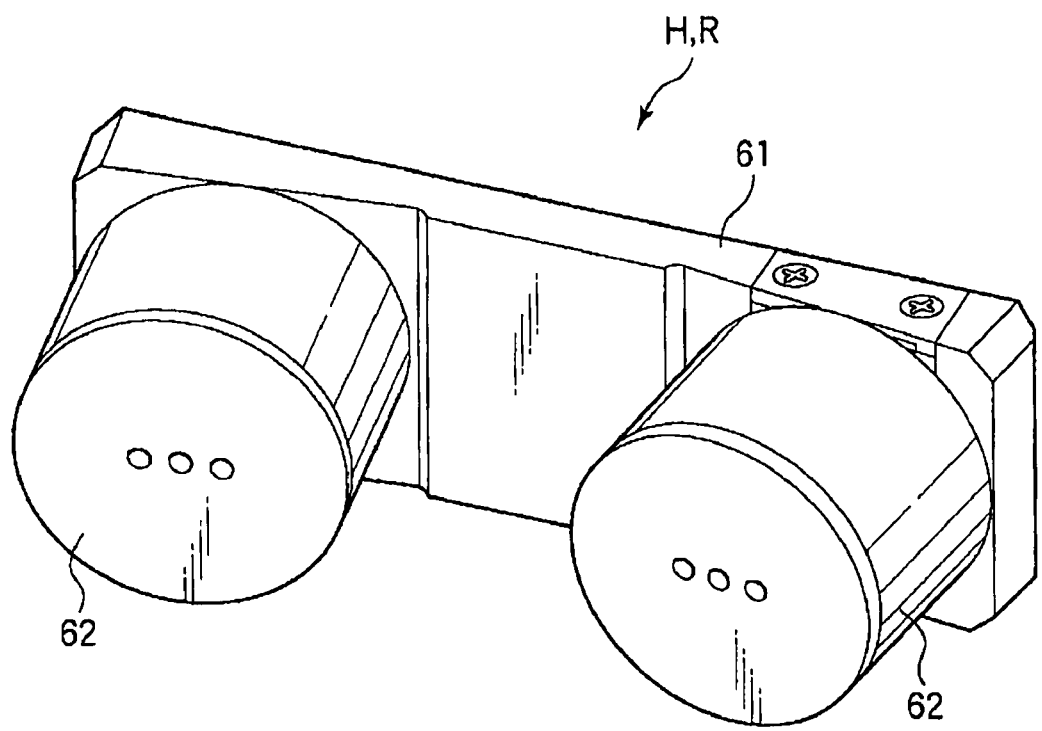
FIG. 6 offers a perspective view of a positioning electromagnet assembly and a rotary electromagnet assembly shown in FIG. 1.
Figure 7:
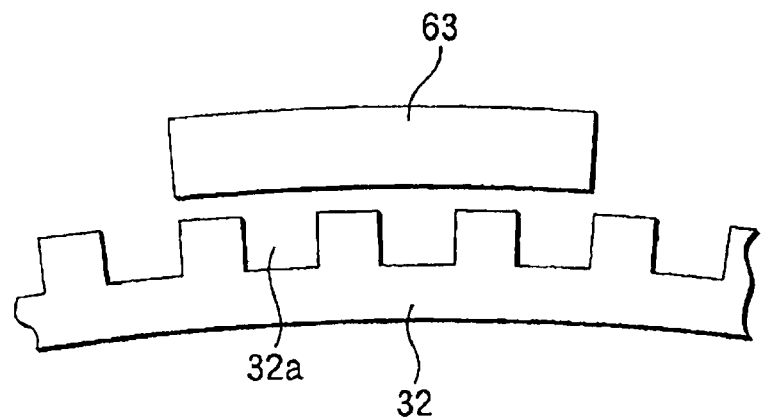
FIG. 7 is an enlarged top view showing positional relationship between an electromagnet side positioning ferromagnetic member and a floater side controlling ferromagnetic member of the positioning electromagnetic assembly.
Figure 8:
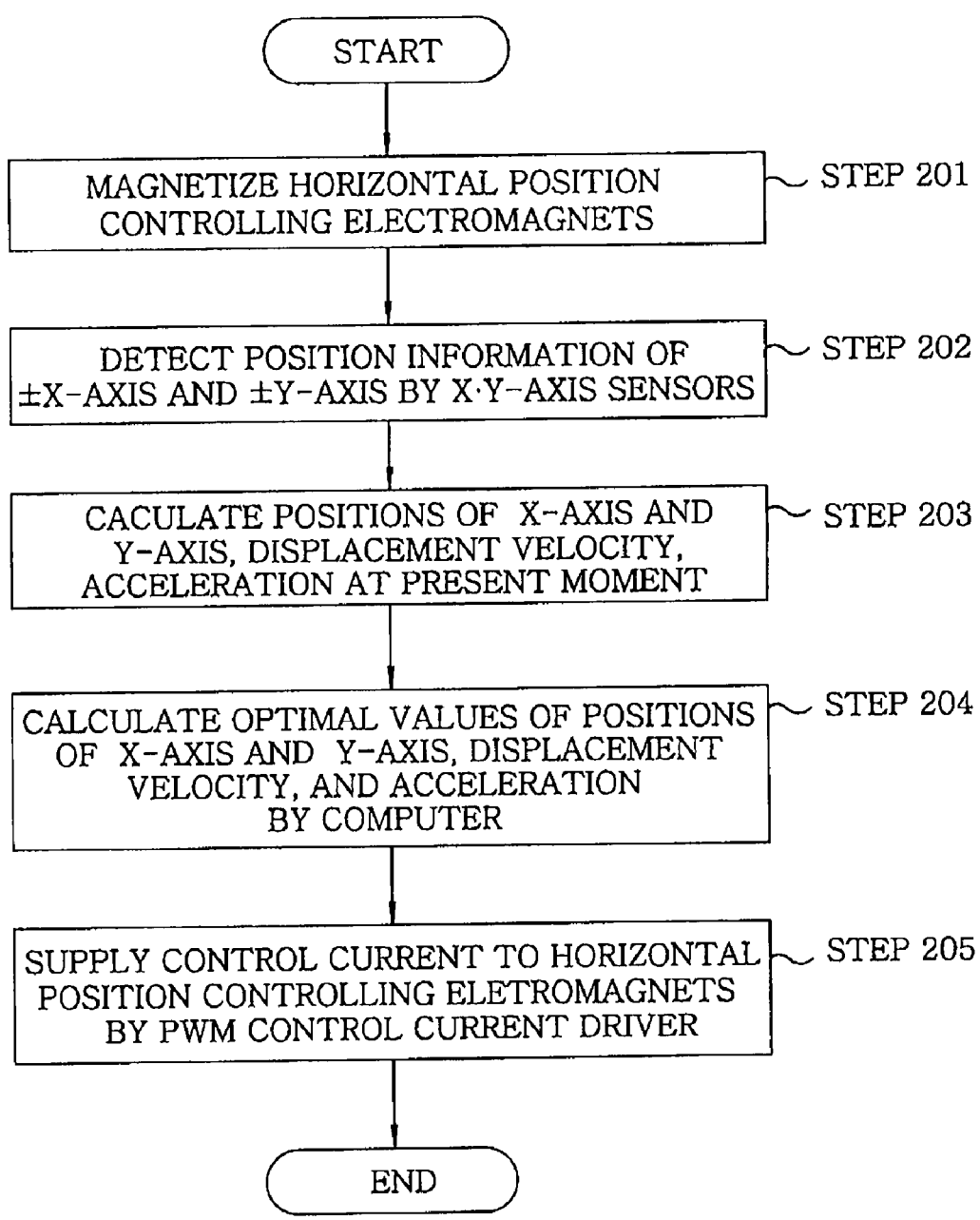
FIG. 8 provides a flowchart illustrating a control flow of the positioning electromagnet assembly.

FIG. 5 represents a top view of the rotary floater and the electromagnet assemblies depicted in FIG. 1, FIG. 6 offers a perspective view of the positioning electromagnet assembly and the rotary electromagnet assembly shown in FIG. 1, FIG. 7 is an enlarged top view showing a positional relationship between an electromagnet side positioning ferromagnetic member and a floater side controlling ferromagnetic member of the positioning electromagnetic assembly, and FIG. 8 provides a flowchart illustrating a control flow of the positioning electromagnet assembly.

As shown in FIGS. 2, 5 and 6, the positioning electromagnet assembly H includes a pair of electromagnets 62 which is provided outside the processing container 2 and connected to each other at rear portions thereof by a yoke 61; and a pair of electromagnet side positioning ferromagnetic members 63 which is disposed at the front sides of the electromagnets 62 to face the floating side controlling ferromagnetic member 32 via a predetermined gap therebetween in the processing container 2 and applies the magnetic attraction to the floater side floating ferromagnetic member 32. Accordingly, a closed magnetic circuit is formed by the pair of electromagnets 62, the yoke 61, the pair of electromagnet side positioning ferromagnetic members 63 and the floater side controlling ferromagnetic member 32.

As depicted in FIGS. 2 and 5, the electromagnet side positioning ferromagnetic members 63 extend in the circumferential direction along the floater side controlling ferromagnetic member 32 formed in a cylindrical shape. Accordingly, an active magnetic area of the magnetic circuit increases and a magnetic resistance decreases, so that the horizontal direction position can be effectively controlled.

Moreover, as illustrated in FIG. 7, uneven tooth profiles 32a are formed on the outer peripheral surface of the cylindrical floater side controlling ferromagnetic member 32 to generate attraction for rotation as will be described later. However, the attraction for controlling the horizontal position which acts between the floater side controlling ferromagnetic member 32 and the electromagnet side positioning ferromagnetic members 63 becomes uniform in any location. For that reason, in order to prevent undesired generation of attraction for rotation in the circumferential direction, it is preferable that end surfaces of the uneven tooth profiles 32a of the floater side controlling ferromagnetic member 32 coincide with end surfaces of the electromagnet side positioning ferromagnetic members 63.

As described in FIG. 1, the floating wall portion 2c of the processing container 2 has grooves 64 which open outwardly horizontally, the electromagnets 62 being fitted in the grooves 64 from an outer lateral side of the processing container 2. The electromagnet side positioning ferromagnetic members 63 face the electromagnets 62 provided outside the floating wall portion 2c via thin bottom walls 65 of the grooves. Accordingly, there arises no need to provide a through hole or the like at the processing container 2, and vacuum sealing of the electromagnets 62 becomes unnecessary, thereby increasing reliability against vacuum leakage of the processing container 2. Further, a thickness of the thin walls 65 is, e.g., about 2 mm.

As illustrated in FIGS. 2, 5 and 6, two positioning electromagnet assemblies H form a pair [(+X-axis, −X-axis), (+Y-axis, −Y-axis)], and the positioning electromagnet assemblies H in each pair are provided to face each other in a diametrical direction. For example, two pairs of positioning electromagnet assemblies H spaced apart from each other at, e.g., about 90 degrees, are arranged along the outer circumference of the rotary floater 30. The positioning electromagnet assemblies H are required to independently control the rotary floater 30 as will be described later, and it is preferable to provide at least three pairs of positioning electromagnet assemblies H. Further, the positioning electromagnet assembly H may have a single electromagnet, and at least three positioning electromagnet assemblies may be provided along the outer circumference of the rotary floater 30.

As shown in FIG. 1, horizontal position sensors 70 (X·Y-axis sensors) for detecting position information of the rotary floater 30 in a horizontal direction are provided to face the floater side controlling ferromagnetic member 32. Three horizontal position sensors 70 (X·Y-axis sensors) are provided while being spaced apart from each other at, e.g., about 120 degrees.

The positioning electromagnetic assemblies H are feedback-controlled in the following sequence based on the detection data of the X·Y-axis sensor 70, as illustrated in FIG. 8.

First, the electromagnet 62 of the positioning electromagnet assemblies H are magnetized (step 201). Then, position information of the rotary floater 30 in a horizontal direction ((+X-axis, −X-axis), (+Y-axis, −Y-axis)) is detected by the X·Y-axis sensors 70 (step 202). Next, positions of ±X-axis and ±Y-axis, a velocity and an acceleration at that moment are calculated based on the position information of the rotary floater 30 in the horizontal direction ((+X-axis, −X-axis), (+Y-axis, −Y-axis)) (step 203). Thereafter, optimal values of the positions of ±X-axis and ±Y-axis, the velocity and the acceleration at that moment are calculated by the computer (step 204).

The magnetization of the electromagnets 62 is controlled by supplying control current to the electromagnets 62 of the positioning electromagnet assemblies H by the PWM control current driver based on the calculation result (step 205).

In addition, in the case of an apparatus in which thermal deformation of the rotary floater 30 can be ignored, two X·Y-axis sensors spaced apart form each other at, e.g., about 90 degrees, may be provided instead of the above-described three horizontal position sensors 70 (X·Y-axis sensors). Besides, X1, Y1, X2, Y2 and Z sensors spaced apart from each other at, e.g., about 90 degrees, at two stage positions may be provided instead of the aforementioned Z-axis sensors 50 and the X·Y-axis sensors 70.

The configuration of the rotary electromagnet assembly R is the same as that of the positioning electromagnet assembly of FIG. 6 with respect to the electromagnets 62 and the yoke 61, except for the electromagnet side rotary ferromagnetic members 73.

Uneven tooth profiles 32a and 73a are formed on the surfaces of the floater side controlling ferromagnetic member 32 and the electromagnet side rotary ferromagnetic members 73 facing each other.

The rotary electromagnet assemblies R rotate the rotary floater 30 in the same manner as in a stepping motor. In other words, when current supplies in one phase, the rotary member moves to a position where protrusions of the tooth profiles 32a of the rotary member and those of the tooth profiles 73a of the fixed member coincidentally face each other by the magnetic attraction. With respect to another phase, the tooth profiles 32a of the rotary member and the tooth profiles 73a of the fixed member are misaligned by 1/N. When the another phase current flows, the tooth profiles 32a of the rotary member rotate by an angle of 1/N. As a result, the rotary floater 30 is rotated.

In this embodiment, as described above, the permanent magnet is not used, so that repulsive force does not occur. For that reason, it is effective to use three or more phase electromagnets. The rotary power can be obtained by magnetizing them sequentially as described above.

Further, the attraction in the horizontal direction as well as the rotary power is generated from the electromagnets 62 of the rotary electromagnet assemblies R. Therefore, the attraction in the horizontal direction can be canceled by arranging a pair of two rotary electromagnet assemblies R to opposite to each other in a diametrical direction in each phase.

In this embodiment, four phase electromagnet assemblies Ra, Rb, Rc and Rd spaced apart from each other at a phase angle of about 90 degrees are disposed opposite to each other in the diametrical direction. At least two pairs of rotary electromagnet assemblies R may be installed as described above.

As set forth above, the positioning electromagnet assembly H and the rotary electromagnet assembly R are positioned in substantially the same horizontal locations (X·Y plane), so that the control can be simplified. Moreover, the positioning electromagnet assembly H and the rotary electromagnet assembly R are arranged alternately along the circumferential direction.

Figure 9:
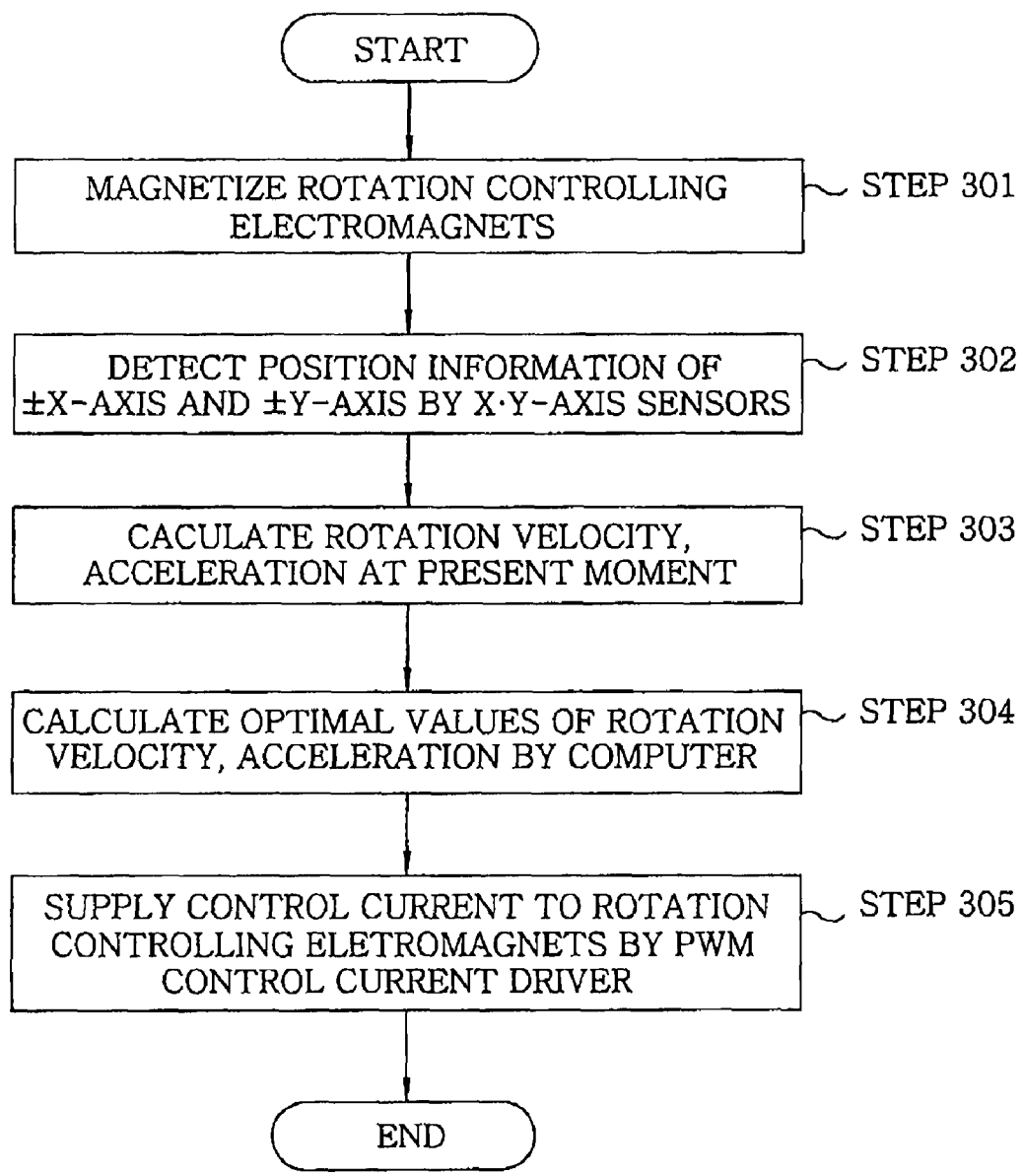
FIG. 9 presents a flowchart depicting a control flow of a rotary electromagnet assembly.

The rotary electromagnet assemblies R are feedback-controlled based on the detection data of the X·Y-axis sensors 70 as will be described below. FIG. 9 is a flowchart showing a control flow of the rotary electromagnet assembly.

First, the electromagnets 62 of the rotary electromagnet assemblies R are magnetized (step 301). Next, position information of the rotary floater 30 in the horizontal direction ((+X-axis, −X-axis), (+Y-axis, −Y-axis)) is detected by the X·Y-axis sensors 70 (step 302). Then, a rotation speed and an acceleration at that moment are calculated based on the position information of the rotary floater 30 in the horizontal direction ((+X-axis, −X-axis), (+Y-axis, −Y-axis)) (step 303). Thereafter, optimal values of the rotation speed and the acceleration are calculated by the computer (step 304).

The magnetization of the electromagnets 62 is controlled by supplying control current to the electromagnets 62 of the rotary electromagnet assemblies R by the PWM control current driver based on the calculation result (step 305).

Figure 10:
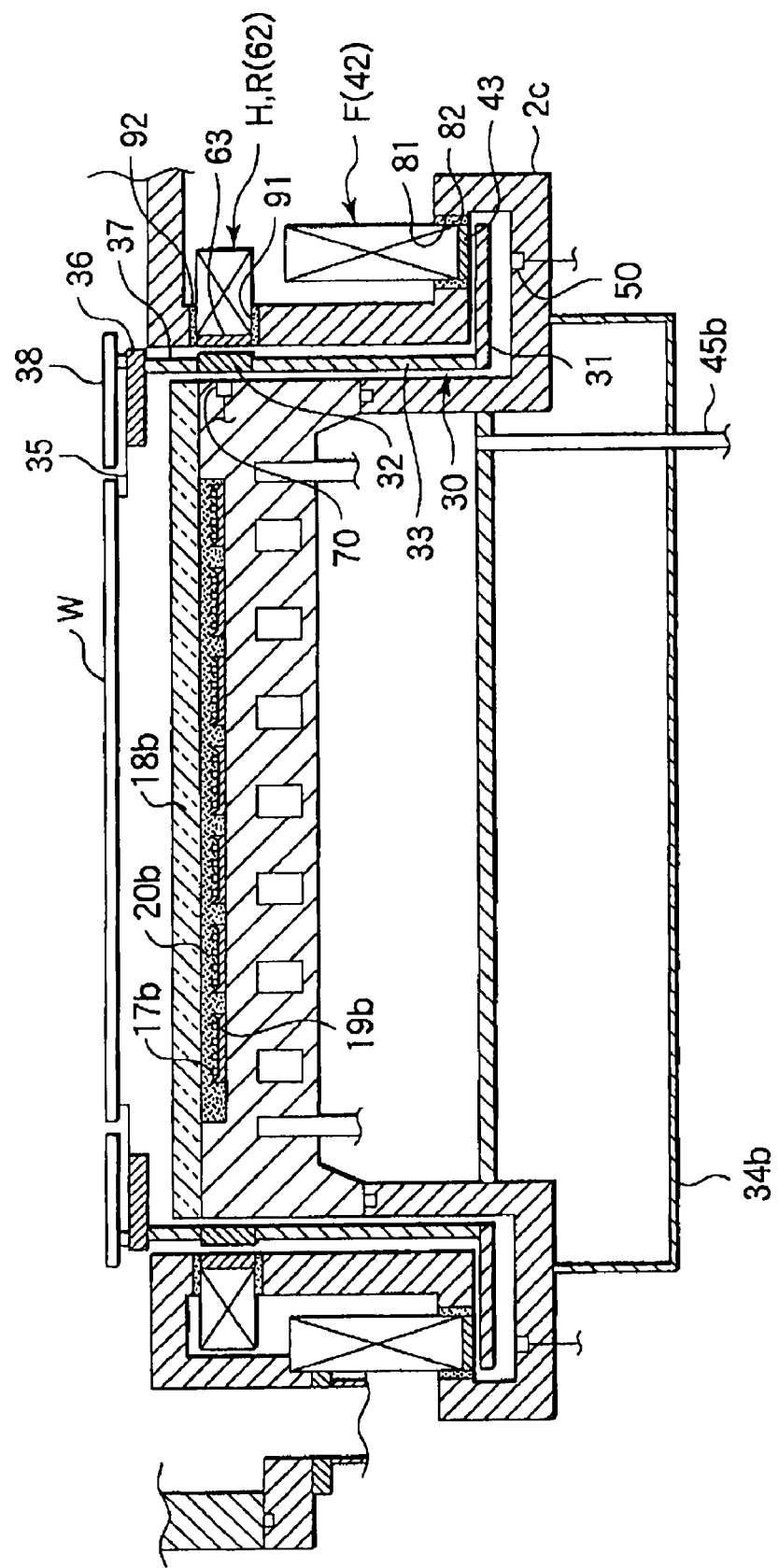
FIG. 10 offers an enlarged fragmentary cross sectional view of an annealing apparatus in accordance with a modification of an embodiment of the present invention.

FIG. 10 provides an enlarged partial cross sectional view of an annealing apparatus in accordance with a modification of the embodiment of the present invention.

In this modification, the floating wall portion 2c of the processing container 2 has through holes 81 penetrating an outer wall thereof vertically, and the electromagnets 42 of the floating electromagnet assemblies F are fitted thereinto from an outer upper side of the processing container 2. Sealing members 82 are provided between the through holes 81 and the electromagnets 42, and the electromagnet side floating ferromagnetic substances 43 are installed at the electromagnets 42 provided outside the processing container.

Further, the floating wall portion 2c of the processing container 2 also has through holes 91 penetrating an outer wall thereof horizontally, and the electromagnets of the positioning electromagnet assemblies H and the rotary electromagnet assemblies R are fitted thereinto from an outer lateral side of the processing container 2. Sealing members 92 are provided between the through holes 91 and the electromagnets 62, and the electromagnet side positioning ferromagnetic members 63 are installed at the electromagnets provided outside the processing container 2.

The sealing members 82 and 92 are made of, e.g., brazing or epoxy resin.

Further, the present invention can be variously modified without being limited to the above embodiments. For example, the above embodiments describe the case where the heating sources having LEDs are provided on both sides of the wafer as an object to be processed. However, the heating source may be provided only on one side thereof. Moreover, although an LED is used as a light emitting element in the above embodiments, it is also possible to use another light emitting element such as a semiconductor laser or the like.

Furthermore, an object to be processed is not limited to a semiconductor wafer, and may be a glass substrate for use in an FPD or the like.

In accordance with the above-described embodiments, the rotary floater for supporting the object to be processed is floated by the magnetic attraction of the electromagnets without contact with the processing container. Further, the rotary floater is rotated by the magnetic attraction of the electromagnets while its horizontal position being controlled by the magnetic attraction. Therefore, it is possible to realize an apparatus capable of preventing generation of particles and obtaining desired in-plane uniformity due to stable floating rotation. Further, the apparatus can ensure high temperature uniformity, so that it is possible to obtain uniform film quality and film thickness and increase a production yield.

Moreover, the rotary floater is floated without contact with the inner wall of the processing container by the rotary electromagnet assemblies which cause the magnetic attraction to act vertically upward. Accordingly, the direction of the magnetic attraction coincides with the direction of the gravity applied to the rotary floater. For that reason, horizontal misalignment does not occur, and the control can be stably carried out. Further, the control can be simplified by positioning the positioning electromagnet assembly and the rotary electromagnet assembly in substantially same horizontal locations.

In that case, if a floating stroke required for vertical movement of the object to be processed W is set, the elevation mechanism of the object to be processed W can be realized by magnetic floating. Accordingly, the structure can be simplified without requiring a conventional elevation mechanism motor, air cylinder or the like.

Further, when the object to be processed is thermally processed, a temperature inside the processing container increases. Therefore, if the permanent magnet is disposed as disclosed in Patent Document 1, the permanent magnet deteriorates by the effects of the heat of a high temperature, and the cost increases. However, the problems caused by the permanent magnet can be provided by combining electromagnets and ferromagnetic member.

What is claimed is:
1. A processing apparatus comprising:
a processing container made of a non-ferromagnetic material, for accommodating an object to be processed;
a rotary floater disposed in the processing container, for supporting the object to be processed;
at least one floating electromagnet assembly provided outside the processing container, for floating the rotary floater without contact with an inner wall of the processing container by causing magnetic attraction to the rotary floater vertically upwardly;
at least one positioning electromagnet assembly provided outside the processing container, for controlling a horizontal direction position of the floated rotary floater by applying magnetic attraction thereto;
at least one rotary electromagnet assembly disposed outside the processing container for rotating the floated rotary floater by applying magnetic attraction thereto; and
a processing mechanism for performing a predetermined processing on the object to be processed supported by the rotary floater,
wherein the rotary floater has a floater side floating ferromagnetic member having a predetermined width extending in a diametrical direction, wherein the floating electromagnet assembly includes:
a pair of electromagnets provided outside the processing container and connected at rear portions thereof by a yoke; and
a pair of electromagnet side floating ferromagnetic members disposed below front sides of the pair of electromagnets in the processing container so as to face the floater side floating ferromagnetic member via a predetermined gap therebetween, for applying magnetic attraction to the floater side floating ferromagnetic member, and
wherein the pair of electromagnets, the yoke, the pair of electromagnet side floating ferromagnetic members and the floater side floating ferromagnetic members form a closed magnetic circuit.

2. The processing apparatus of claim 1, wherein the floater side floating ferromagnetic member is formed in a flat ring shape.

3. The processing apparatus of claim 1, wherein the floater side floating ferromagnetic member is formed in a flat ring shape, and wherein the electromagnet side floating ferromagnetic members extend in a circumferential direction along the floater side floating ferromagnetic member.

4. The processing apparatus of claim 1, wherein the processing container has grooves which open upward in an outer wall thereof, the electromagnets being fitted in the grooves from an outer upper side of the processing container, and wherein the electromagnet side floating ferromagnetic members face the electromagnets disposed outside the processing container via thin bottom walls of the grooves.

5. The processing apparatus of claim 1, wherein the processing container has openings penetrating an outer wall thereof vertically, and the electromagnets are fitted thereinto from an outer upper side of the processing container; sealing members are provided between the holes and the electromagnets; and the electromagnet side floating ferromagnetic members are installed at the electromagnets provided outside the processing container.

6. The processing apparatus of claim 1, wherein at least three floating electromagnet assemblies are disposed along an outer circumference of the rotary floater.

7. The processing apparatus of claim 1, further comprising vertical position sensors for detecting position information of the rotary floater in a vertical direction.

8. The processing apparatus of claim 7, further comprising a control unit for supplying control current to the electromagnets of the floating electromagnet assembly by calculating a vertical position, an inclination, a displacement velocity and an acceleration at that moment, based on the vertical position information of the rotary floater which is detected by the vertical position sensors, and calculating optimal values thereof.

9. The processing apparatus of claim 1, wherein the rotary floater has a floater side controlling ferromagnetic member having a predetermined width extending in a vertical direction.

10. The processing apparatus of claim 9, wherein the floater side controlling ferromagnetic member is formed in a cylindrical shape.

11. The processing apparatus of claim 9, wherein the positioning electromagnet assembly includes:
a pair of electromagnets provided outside the processing container and connected at rear portions thereof by a yoke; and
a pair of electromagnet side positioning ferromagnetic members disposed at lateral portions of front sides of the pair of electromagnets in the processing container to face the floater side controlling ferromagnetic member via a predetermined gap therebetween, for applying magnetic attraction to the floater side controlling ferromagnetic member,
wherein the pair of electromagnets, the yoke, the pair of electromagnet side positioning ferromagnetic members and the floater side controlling ferromagnetic member form a closed magnetic circuit.

12. The processing apparatus of claim 11, wherein the floater side controlling ferromagnetic member is formed in a cylindrical shape, and wherein the electromagnet side positioning ferromagnetic members extend in a circumferential direction along the floater side controlling ferromagnetic member.

13. The processing apparatus of claim 11, wherein the processing container has grooves which open in an outer wall thereof horizontally, the electromagnets being fitted in the grooves from an outer lateral side of the processing container, and wherein the electromagnet side positioning ferromagnetic members are provided to face the electromagnets disposed outside the processing container via thin bottom walls of the grooves.

14. The processing apparatus of claim 11, wherein the processing container has opening penetrating on outer wall thereof horizontally, and the electromagnets are fitted thereinto from an outer lateral side of the processing container; sealing members are provided between the holes and the electromagnets; and the electromagnet side positioning ferromagnetic members are installed at the electromagnets provided outside the processing container.

15. The processing apparatus of claim 9, wherein at least three positioning electromagnet assemblies are disposed along the outer circumference of the rotary floater.

16. The processing apparatus of claim 9, further comprising horizontal position sensors for detecting position information of the rotary floater in the horizontal direction.

17. The processing apparatus of claim 16, further comprising a control unit for supplying control current to the electromagnets of the positioning electromagnet assembly by calculating a horizontal position, a velocity and an acceleration at that moment, based on horizontal position information of the rotary floater which is detected by the horizontal position sensors, and calculating optimal values thereof.

18. The processing apparatus of claim 16, further comprising a control unit for supplying control current to the electromagnets of the rotary electromagnet assembly by calculating a rotation speed and an acceleration at that moment, based on horizontal position information of the rotary floater which is detected by the horizontal position sensors, and calculating optimal values thereof.

19. The processing apparatus of claim 1, wherein the positioning electromagnet assembly and the rotary electromagnet assembly are positioned in substantially the same horizontal locations.

20. The processing apparatus of claim 19, wherein the rotary electromagnet assembly includes:
a pair of electromagnets provided outside the processing container and connected at rear portions thereof by a yoke; and
a pair of electromagnet side rotary ferromagnetic members disposed at lateral portions of front sides of the pair of electromagnets in the processing container to face the floater side controlling ferromagnetic member via a predetermined gap therebetween, for applying magnetic attraction to the floater side controlling ferromagnetic member, wherein the pair of electromagnets, the yoke, the pair of electromagnet side rotary ferromagnetic members and the floater side controlling ferromagnetic member form a closed magnetic circuit.

21. The processing apparatus of claim 20, wherein uneven tooth profiles are formed on surfaces of the floater side controlling ferromagnetic member and the electromagnet side rotary ferromagnetic members facing each other.

22. The processing apparatus of claim 20, wherein the floater side controlling ferromagnetic member is formed in a cylindrical shape, and wherein the electromagnet side rotary ferromagnetic members extend in a circumferential direction along the floater side controlling ferromagnetic member.

23. The processing apparatus of claim 20, wherein the processing container has grooves which open on in outer wall thereof horizontally, the electromagnets being fitted from an outer lateral side of the processing container, and wherein the electromagnet side rotary ferromagnetic members are provided to face the electromagnets disposed outside the processing container via thin bottom walls of the grooves.

24. The processing apparatus of claim 20, wherein the processing container has openings penetrating an outer wall thereof horizontally, and the electromagnets are fitted thereinto from an outer lateral side of the processing container; sealing members are provided between the holes and the electromagnets; and the electromagnet side rotary ferromagnetic members are installed at the electromagnets provided outside the processing container.

25. The processing apparatus of claim 19, wherein two rotary electromagnet assemblies form a pair, and the rotary electromagnet assemblies in each pair are provided opposite to each other in a diametrical direction, and at least two pairs of the rotary electromagnet assemblies are arranged along an outer circumference of the rotary floater.

26. The processing apparatus of claim 25, wherein the positioning electromagnet assembly and the rotary electromagnet assembly are arranged alternately in a circumferential direction.

* * * * *